(12) United States Patent
Matsunaga et al.

(10) Patent No.: US 7,786,589 B2
(45) Date of Patent: Aug. 31, 2010

(54) SEMICONDUCTOR DEVICE AND METHOD FOR MANUFACTURING SEMICONDUCTOR DEVICE

(75) Inventors: Noriaki Matsunaga, Kanagawa-ken (JP); Yoshiaki Shimooka, Tokyo (JP); Naofumi Nakamura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/951,559

(22) Filed: Dec. 6, 2007

(65) Prior Publication Data

US 2008/0296775 A1    Dec. 4, 2008

(30) Foreign Application Priority Data

Dec. 6, 2006  (JP)  ............................. 2006-329891
Nov. 7, 2007  (JP)  ............................. 2007-290071

(51) Int. Cl.
*H01L 23/52* (2006.01)
(52) U.S. Cl. ........................ 257/773; 257/777
(58) Field of Classification Search ................. 257/410, 257/605, 701, 750, 784, 758–760; 438/125, 438/216, 261, 421, 591, 595, 617, 652, 118, 438/622–624
See application file for complete search history.

(56) References Cited

U.S. PATENT DOCUMENTS

| 6,064,118 | A * | 5/2000 | Sasaki ........................ 257/758 |
| 6,174,796 | B1 * | 1/2001 | Takagi et al. ................ 438/622 |
| 6,645,873 | B2 | 11/2003 | Shimizu et al. |
| 6,841,464 | B2 * | 1/2005 | Barnes et al. ............... 438/622 |
| 2003/0173674 | A1 | 9/2003 | Nakamura |
| 2003/0183940 | A1 * | 10/2003 | Noguchi et al. ............. 257/767 |
| 2005/0167842 | A1 | 8/2005 | Nakamura et al. |
| 2007/0158849 | A1 | 7/2007 | Higashi et al. |

FOREIGN PATENT DOCUMENTS

| JP | 8-250593 | 9/1996 |
| JP | 8-306775 | 11/1996 |
| JP | 10-294316 | 11/1998 |
| JP | 2001-217312 | 8/2001 |
| JP | 2002-353303 | 12/2002 |
| JP | 2003-273210 | 9/2003 |
| JP | 2003-297918 | 10/2003 |
| JP | 2006-19401 | 1/2006 |

* cited by examiner

*Primary Examiner*—Wai-Sing Louie
*Assistant Examiner*—Sue Tang
(74) *Attorney, Agent, or Firm*—Oblon, Spivak, McClelland, Maier & Neustadt, L.L.P.

(57) ABSTRACT

In one aspect of the present invention, a semiconductor device may include a semiconductor substrate having a semiconductor element on an upper surface, a first dielectric film provided on the semiconductor substrate, a second dielectric film provided on the first dielectric film, a metal ring provided in the first dielectric film and the second dielectric film and configured to form a closed loop in a plan view, a first region surrounded by the metal ring in a plan view, a second region provided outside of the metal ring in a plan view, a plurality of via contacts provided in the first dielectric film in the first and second region, a plurality of wirings provided in the second dielectric film in the first and second region, and an air gap provided in the second dielectric film in the first region.

17 Claims, 16 Drawing Sheets

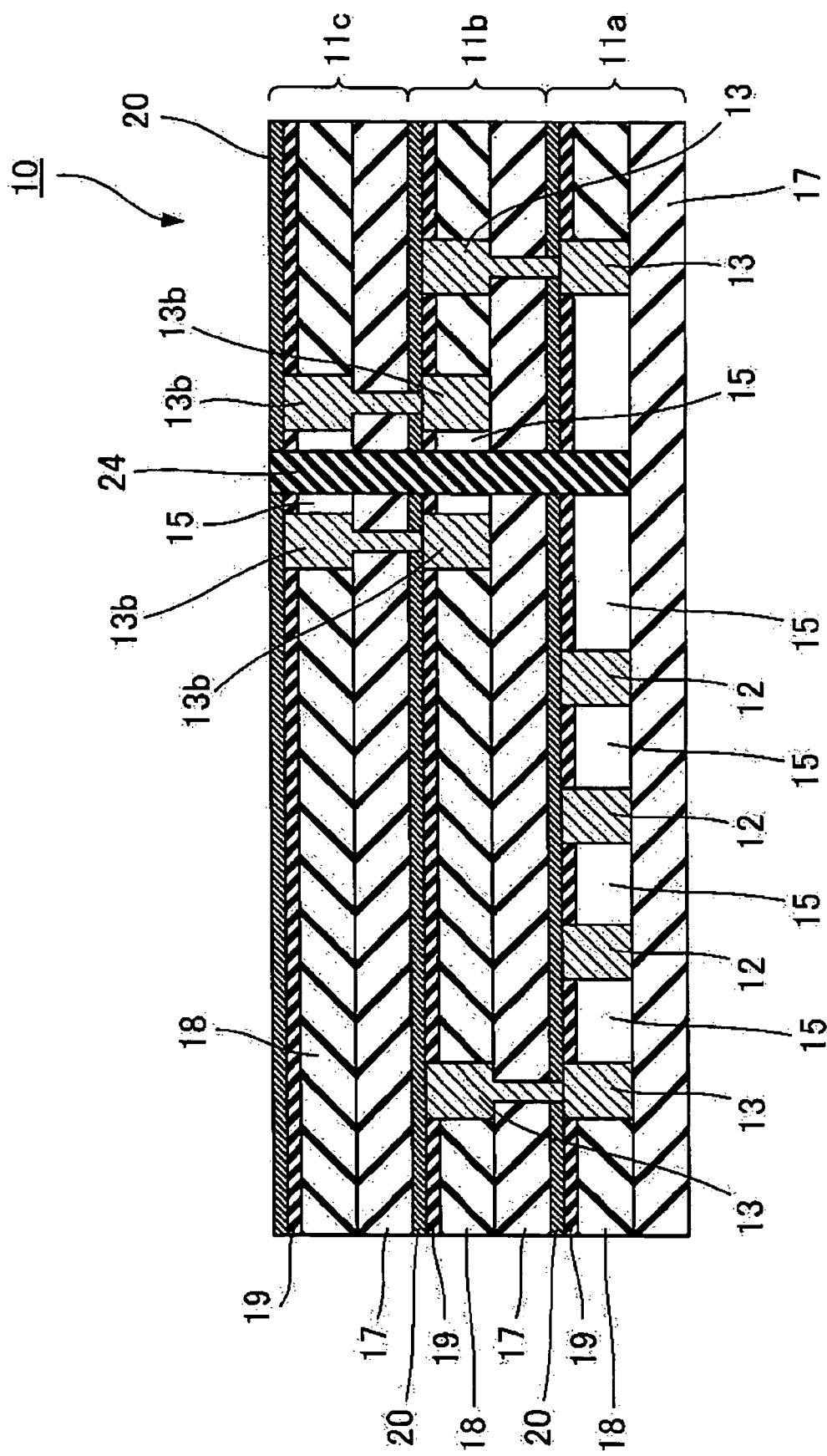

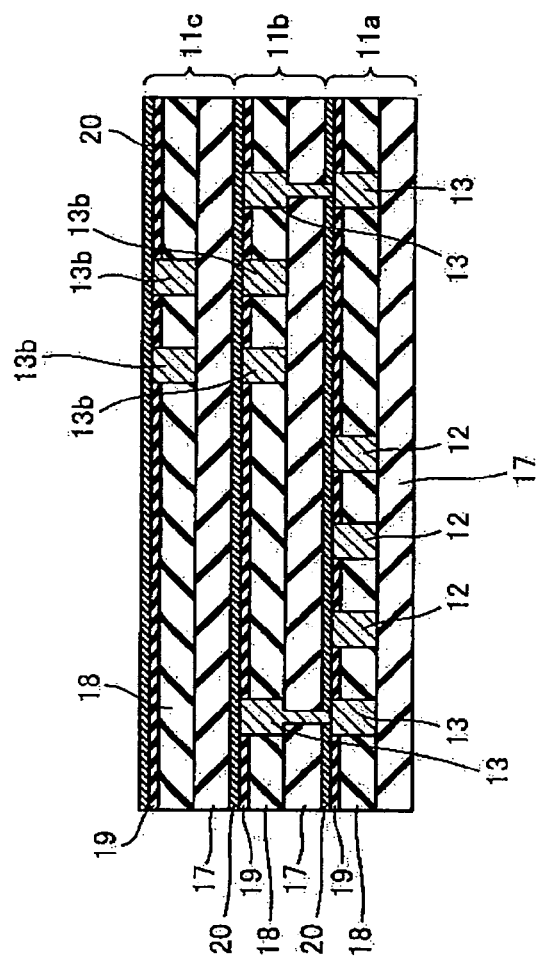
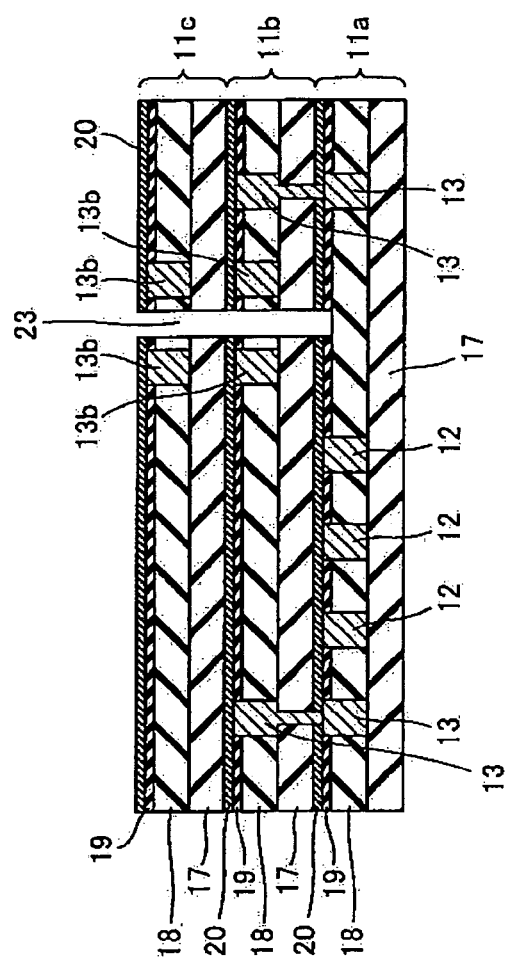
Fig.10A
Fig.10B

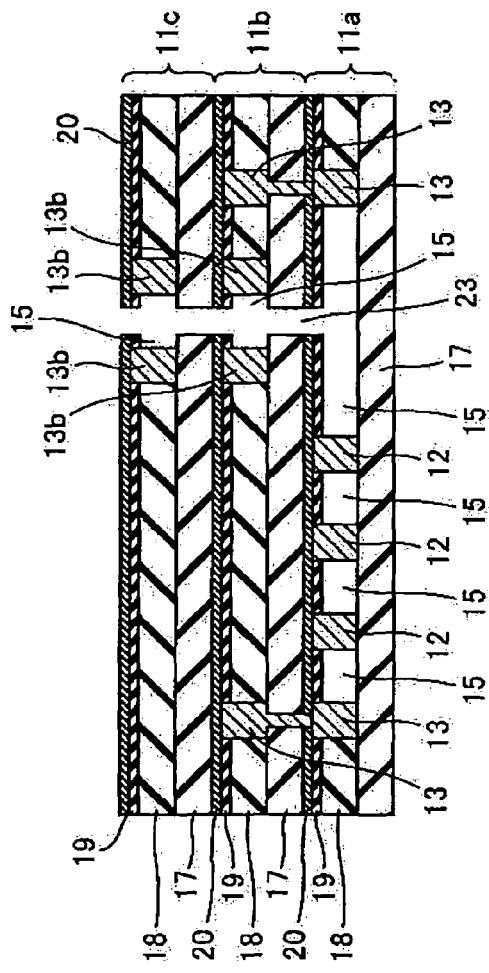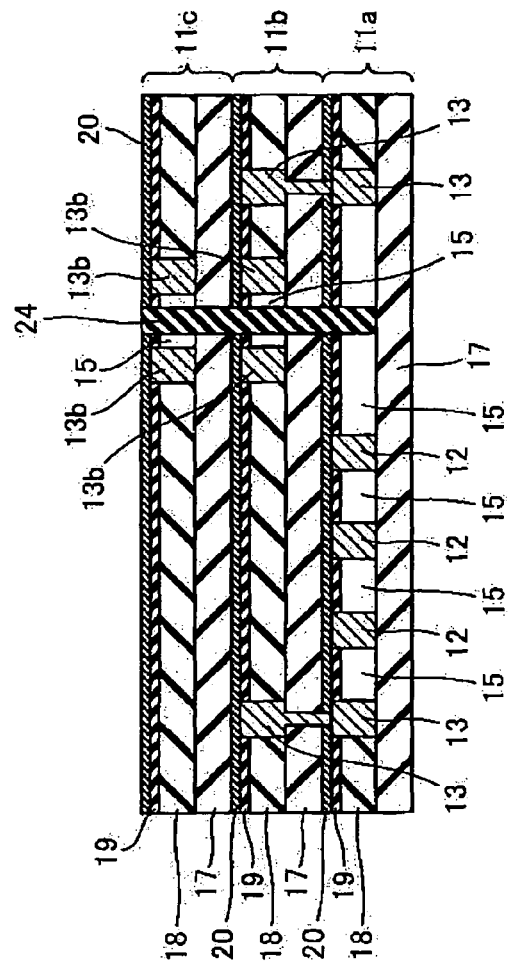

US 7,786,589 B2

SEMICONDUCTOR DEVICE AND METHOD FOR MANUFACTURING SEMICONDUCTOR DEVICE

CROSS REFERENCE TO RELATED APPLICATION

This application is based upon and claims the benefit of priority from Japanese Patent Application No. 2006-329891, filed on Dec. 6, 2006, and from Japanese Patent Application No. 2007-290071, filed on Nov. 7, 2007, the entire contents of which are incorporated herein by reference.

BACKGROUND

An air gap in a semiconductor device is proposed so as to reduce a capacitance between signal wirings. If the capacitance between signal wirings is increased, a parasitic capacitance in the semiconductor device is also increased, so an operational speed in the semiconductor device may be worsened.

SUMMARY

Aspects of the invention relate to an improved semiconductor device.

In one aspect of the present invention, a semiconductor device may include a semiconductor substrate having a semiconductor element on an upper surface, a first dielectric film provided on the semiconductor substrate, a second dielectric film provided on the first dielectric film, a metal ring provided in the first dielectric film and the second dielectric film and configured to form a closed loop in a plan view, a first region surrounded by the metal ring in a plan view, a second region provided outside of the metal ring in a plan view, a plurality of via contacts provided in the first dielectric film in the first and second region, a plurality of wirings provided in the second dielectric film in the first and second region, and an air gap provided in the second dielectric film in the first region.

In another aspect of the invention, a semiconductor device may include a semiconductor substrate having a semiconductor element on an upper surface, a first dielectric film provided on the semiconductor substrate, a second dielectric film provided on the first dielectric film, a first metal ring provided in the first dielectric film and the second dielectric film and configured to form a closed loop in a plan view, a second metal ring provided in the first dielectric film and the second dielectric film, configured to form a closed loop in a plan view, and provided in the second metal ring, a first region surrounded by the first metal ring and provided outside of the second metal ring in a plan view, a second region provided outside of the first metal ring in a plan view, a third region surrounded by the second metal ring in a plan view, a plurality of via contacts provided in the first dielectric film in the first and second region, a plurality of wirings provided in the second dielectric film in the first region and the second region, and an air gap provided in the second dielectric film in the first region.

In one aspect of the present invention, A method for manufacturing semiconductor device may include forming a first dielectric film on a semiconductor substrate having a semiconductor element on an upper surface, forming a wiring structure in the first dielectric film, forming a metal ring in the first dielectric film so as to form a closed loop in a plan view, forming a second dielectric film on the first dielectric film, the wiring structure and the metal ring, forming a outlet inside the closed loop of the metal ring so as to expose a part of the first dielectric film in the inside the closed loop of the metal ring, removing the first dielectric film in the closed loop of the metal ring.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

FIG. 9 is a cross sectional view taken along C-C in FIG. 7.

FIGS. 10A-10D are cross sectional view showing a manufacturing process of a semiconductor device in accordance with the fifth embodiment.

DETAILED DESCRIPTION

Figure 1:
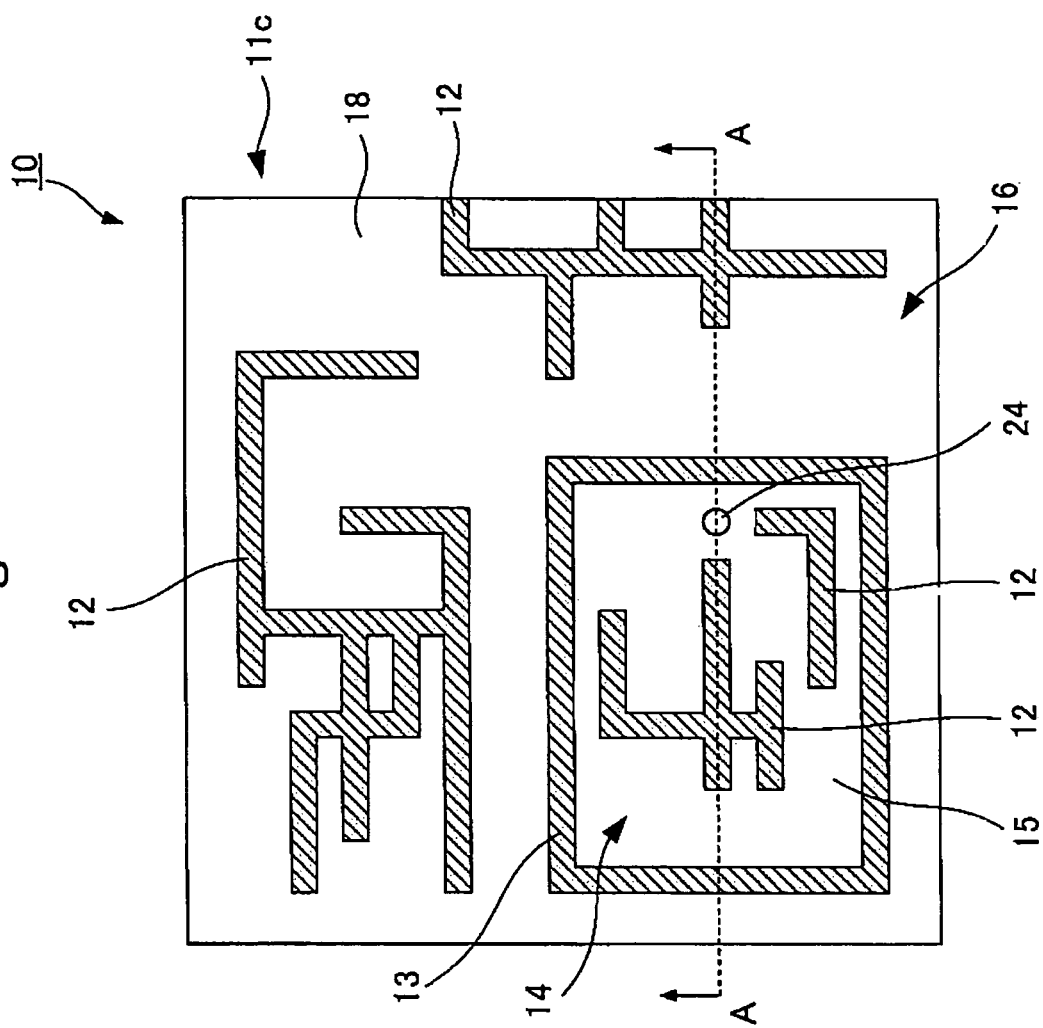
FIG. 1 is a plan view of a semiconductor device in accordance with a first embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

A first embodiment of the present invention will be explained hereinafter with reference to FIGS. 1-3D.

Figure 2:
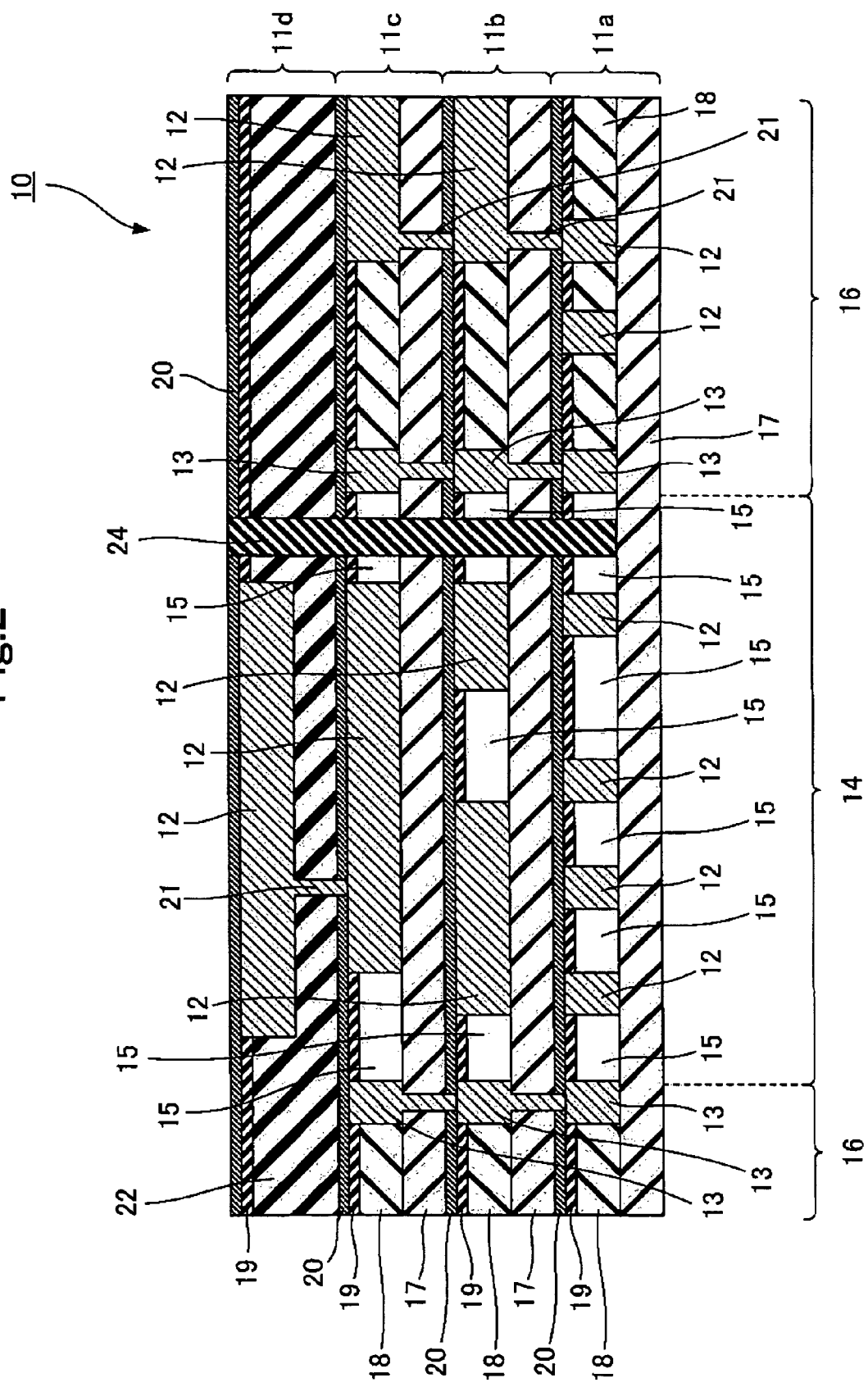
FIG. 2 is a cross sectional view taken along A-A in FIG. 1.

FIG. 1 is a plan view of a semiconductor device 10 in accordance with a first embodiment. FIG. 2 is a cross sectional view taken along A-A in FIG. 1.

As shown in FIGS. 1 and 2, in the semiconductor device 10, a plurality of wiring layers 11a-11d are provided on a semiconductor substrate (not shown) having a semiconductor element on its upper surface. One of the wiring layers 11a-11d, the wiring layer 11c, is described in FIG. 1 as a plan view. The semiconductor device 10 may have more than or less than the four layered wiring layers.

The wiring layers 11a, 11b, and 11c have a first interlayer dielectric film 17, a second interlayer dielectric film 18 provided on the first interlayer dielectric film 17, a wiring 12 provided in the second interlayer dielectric film 18, a via contact (via) 21 provided in the first interlayer dielectric film 17, a first cap film 19 provided on the second interlayer dielectric film 18, and a second cap layer 19 provided on an top surface of the first cap layer 19. The via contacts 21 are configured to electrically connect wirings provided on and under the via contacts 21.

The second interlayer dielectric layer 18 is made of a organic dielectric material such as a polyarylene, a benzoxazole or the like.

The first inter layer dielectric film 17 is made of a dielectric material which has a good etching rate ratio to the second interlayer dielectric film 18, such as a SiOC, a $SiO_2$, a SiOCH, a SiOF or the like.

The wiring 12 is made of Cu. A barrier metal (not shown in the figures) is provided on the wiring so as to prevent a metal in the wiring 12 from diffusing to the interlayer dielectric films 17 and 18.

The via contacts 21 is made of the same material as the wiring 12 and provided on the barrier metal.

The first cap film 19 is made of a dielectric material such as a SiO2, a SiC, a SiOCH, a SiOC or the like. The first cap film 19 may function as a stopper for planarizing by a CMP (Chemical Mechanical Polishing). The first cap film 19 may function as supporting the interlayer dielectric films 17 and 18, when an air gap is provided in the interlayer dielectric film 18.

The second cap film 20 is made of a dielectric material such as a SiC, a SiN, a SiCN or the like. The second cap film 20 may function as preventing a metal in the wiring 12 from diffusing to a third interlayer dielectric film provided on the second cap film 20. The second cap film 20 may be provided on the wiring 20 but not provided on the first cap film 19.

A metal ring 13 is provided in the wiring layers 11a, 11b, and 11c. The metal ring 13 forms a closed loop in a plan view as shown in FIG. 1. The metal ring 13 is formed by wiring 20, or the via contact 21 and wiring 20.

Inside the closed loop of the metal ring 13, an air gap region (first region) 14 is provided. Outside of the closed loop of the metal ring 13, a non-air gap region (second region) 16 is provided. In other words, the air gap region 14 is surrounded by the metal ring 13, and the non-air gap region 16 is provided outside of the metal ring 13 in a plan view.

In the air gap region 14, an air gap 15 is provided in the second interlayer dielectric film 18.

In the non-air gap region 16, an air gap 15 is not provided in the second interlayer dielectric film 18.

In the wiring layer 11d, the metal ring 13 and the air gap 15 are not provided. The wiring layer 11d has the third interlayer dielectric film 22 substitute of the first and second interlayer dielectric film 17 and 18. The other structure is the same as the first and second interlayer dielectric film 17 and 18.

The third interlayer dielectric layer 22 is made of a dielectric material such as a SiOC, a SiO2, a SiOCH, a SiOF or the like. The third interlayer dielectric film 23 may be the same material as the first interlayer dielectric film 17.

In the semiconductor device 10, a cover member 24 is provided in an outlet 23.

The cover member 24 is made of a metal, a ceramic paste, a mold resin, a SiO2, a SiOC, a dielectric which is formed by using a relative high viscosity solution, such as SOD (Spin on Dielectric) or a SOG (Spin on glass), or the like. The shape of the cover member 24 is not limited to the shape as shown in FIG. 2. The cover member 24 is provided in the outlet 23 so as to cover the opening of the outlet 23.

Next, a manufacturing process of the semiconductor device 10 will be explained hereinafter with reference to FIGS. 3A-3D.

FIGS. 3A-3D are cross sectional view showing a manufacturing process of a semiconductor device 10 in accordance with the first embodiment.

Figure 3A:
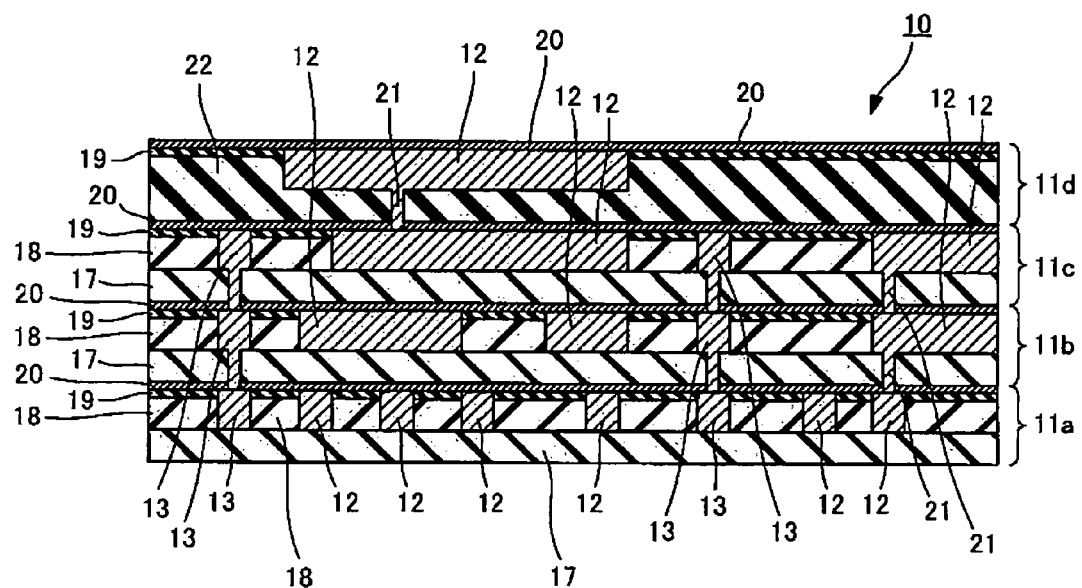
FIGS. 3A-3D are cross sectional view showing a manufacturing process of a semiconductor device in accordance with the first embodiment.

As shown in FIG. 3A, the wiring layers 11a, 11b, 11c and 11d are provided on a semiconductor substrate.

Figure 3B:
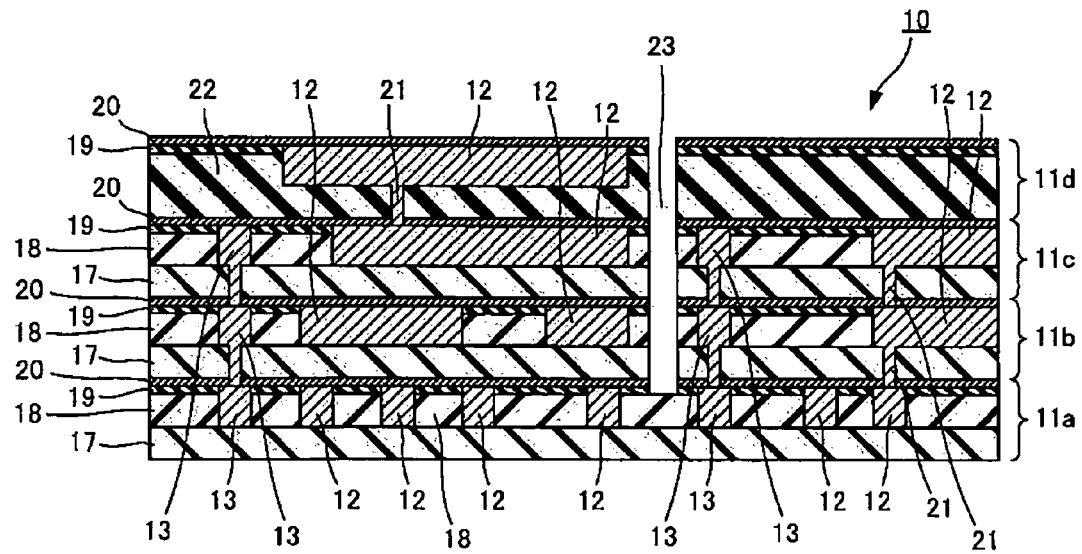

As shown in FIG. 3B, the outlet 23 is provided in the air gap region 14. The second interlayer dielectric film 18 in the wiring layer 11a is exposed from the outlet 23. The outlet 23 is formed by lithography and anisotropic etching such as RIE (Reactive Ion Etching). A plurality of outlets 23 may be formed in the air gap region 14 so as to improve efficiency of forming the air gap 15.

The outlet 23 may be formed by forming a metal pillar and removing the metal pillar. The metal pillar which is made of via contact 21 and wiring 12 may be formed in a position the outlet 23 is formed, and the metal pillar is removed by etching using a hydroperoxide ($H_2O_2$) and Hydrochloric acid (HCl), and the outlet 23 is formed.

Figure 3C:
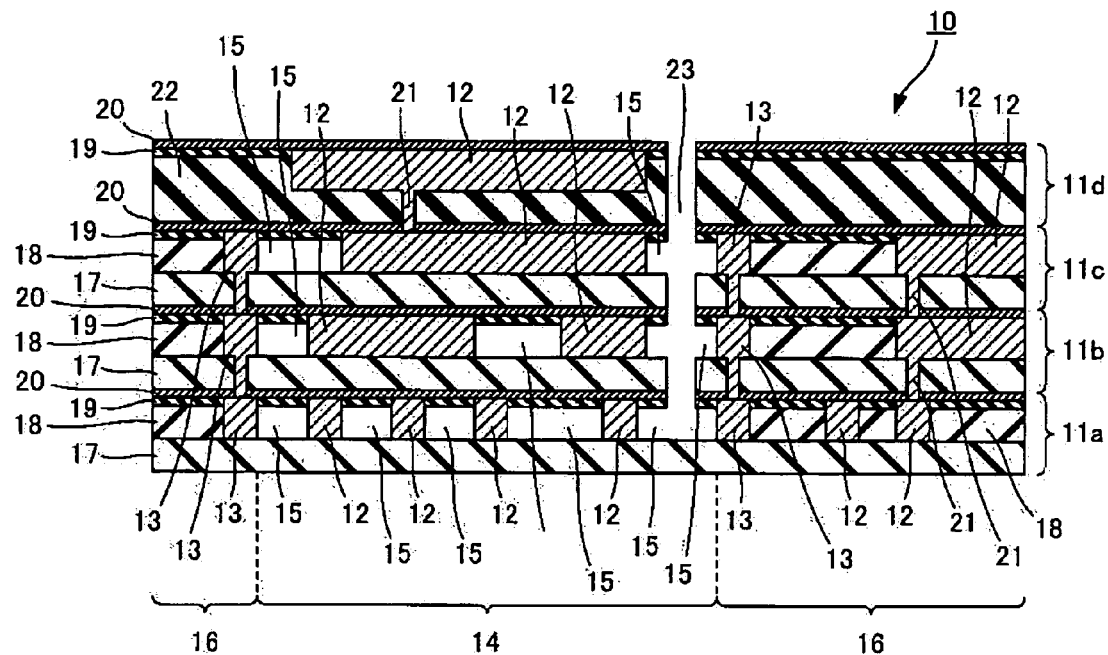

As shown in FIG. 3C, in the air gap region 14, the second interlayer dielectric film 18 in the wiring layers 11a, 11b, and 11c are removed by an etching. The etchant for the etching is supplied from the outlet 23. The air gap 15 may be formed by an isotropic etching such as a down flow type chemical dry etching using a radical of oxygen, nitrogen, hydrogen or the like as the etchant. So the air gap 15 is provided in the wiring layers 11a, 11b, and 11c in the air gap region 14. The reaction product is removed via the outlet 23. In case the second interlayer dielectric film 18 in the wiring layers 11a, 11b, and 11c is removed by a wet etching, a reaction product may be removed by vaporizing the reaction product and exhausted from the outlet 23.

In this process, the second interlayer dielectric 18 in the non-air gap region 16 is not removed, since the etchant is not supplied to the outside of the metal ring 13.

Figure 3D:
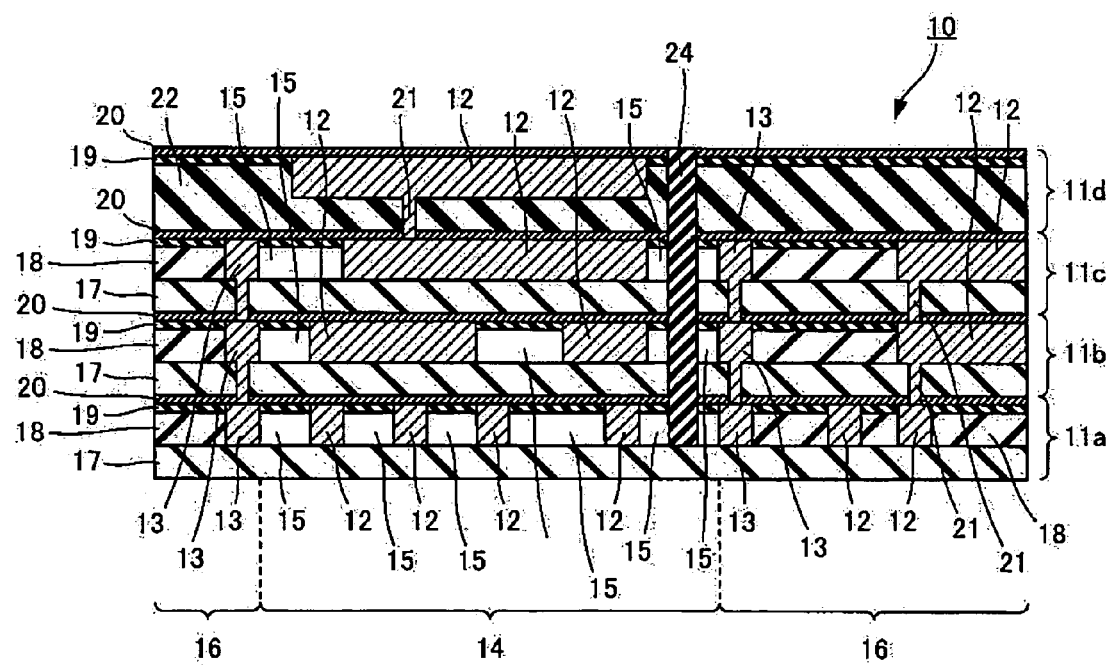

As shown in FIG. 3D, the cover member 24 is provided in the outlet 23. In this case, the cover member 24 may have a viscosity so as not to be provided to the air gap 15 during forming the cover member 24.

The cover member 24 may be the same material as the third interlayer dielectric film 22 and formed in a same manufacturing process. In this case, after forming the air gap 15 in the wiring layers 11a, 11b, and 11c, the third interlayer dielectric 22 in the wiring layer 11d is formed on the wiring layer 11c. So, the material of the third interlayer dielectric 22 is provided in the outlet 23 and the cover member 24 is provided. Furthermore, in case the third interlayer dielectric film 22 is formed in a film forming condition which has low step coverage, the cover member 24 may be provided only near the top portion of the outlet 23.

In this first embodiment, the air gap region 14 which has the air gap 15 in the second interlayer dielectric film 18 and the non-air gap region 16 which does not have the air gap 15 in the second interlayer dielectric film 18 are provided in the semiconductor device 10. So, the low capacitance between the wirings is obtained in the air gap region 14, in which high speed signal transmission is needed. The mechanical strength is provided in the non-air gap region 16, since the second interlayer dielectric film 18 is mechanically stronger than the air gap 15.

In the air gap region 14, it is preferably that the wirings 12 do not constitute a closed loop, since the etchant is not provided inside of the closed loop and an extra outlet is necessary to form the air gap 15 inside of the closed loop.

Second Embodiment

A second embodiment is explained with reference to FIGS. 4A-4E.

FIGS. 4A-4E are cross sectional view showing a manufacturing process of a semiconductor device 10 in accordance with the second embodiment.

Figure 4A:
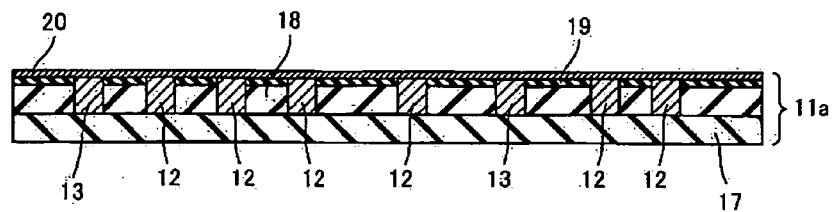
FIGS. 4A-4E are cross sectional view showing a manufacturing process of a semiconductor device in accordance with a second embodiment.

As shown in FIG. 4A, the wiring layer 11a is provided on or above the semiconductor substrate (not shown in FIG. 4A-4E).

Figure 4B:
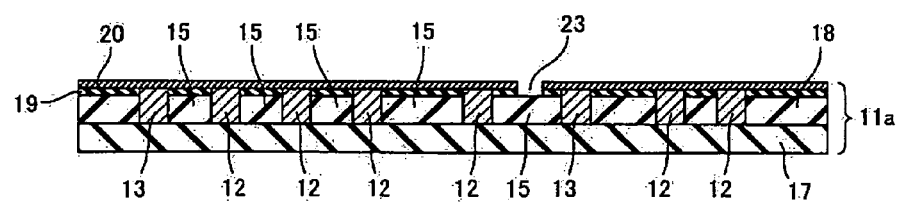

As shown in FIG. 4B, the outlet 23 is provided inside of the metal ring 13 (the air gap region 14). The second interlayer dielectric film 18 is exposed from the outlet 23.

Figure 4C:
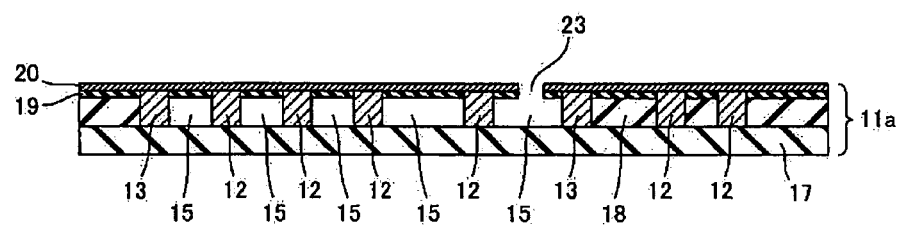

As shown in FIG. 4C, the second interlayer dielectric film 18 in the air gap region 14 is removed by isotropic etching. So the air gap 15 is provided in the wiring layer 11a.

Figure 4D:
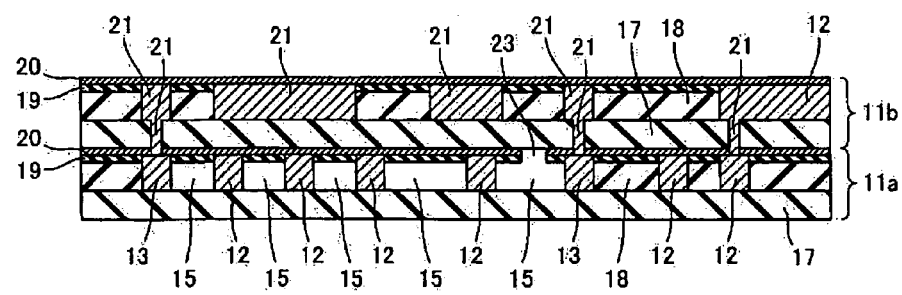

As shown in FIG. 4D, the wiring layer 11b is provided on the wiring layer 11a. In this process, the first interlayer dielectric film 17 in the wiring layer 11b is provided on top of the air gap 15 in the air gap region 14. So the air gap 15 is shut by the wiring layer 11b.

Figure 4E:
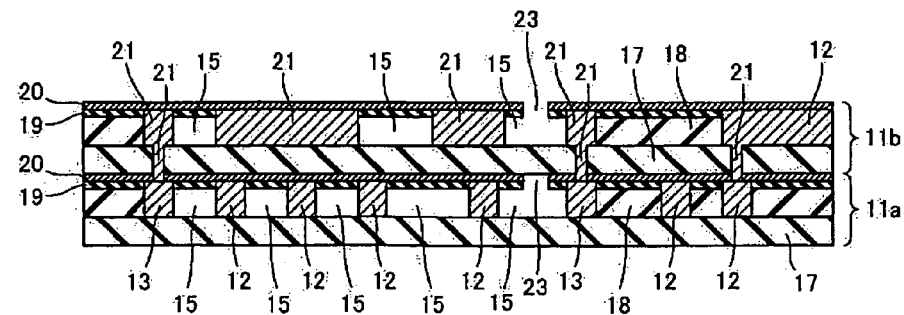

As shown in FIG. 4E, as same as the wiring layer 11a, the air gap 15 is provided in the wiring layer 11b and 11a. Later that, the wiring layer 11d which does not have the air gap 15 is provided on the wiring layer 11d.

In this second embodiment, the outlet 23 is covered by the upper wiring layer. So the cover member 24 is not necessary.

Third Embodiment

A third embodiment of the present invention will be explained hereinafter with reference to FIGS. 5A-5E.

FIGS. 5A-5E are cross sectional view showing a manufacturing process of a semiconductor device in accordance with a third embodiment. FIGS. 5A-5E is an enlarged cross sectional view around the wiring 12 and via contact 21.

Figure 5A:
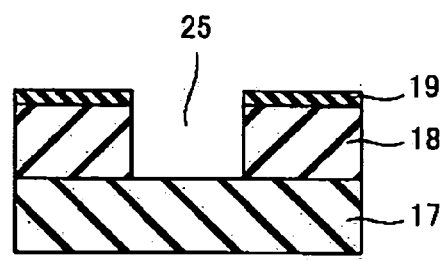
FIGS. 5A-5E are cross sectional view showing a manufacturing process of a semiconductor device in accordance with a third embodiment.

As shown in FIG. 5A, a trench 25 for the wiring 12 is provided in the second interlayer dielectric film 18 and the first cap film 19.

Figure 5B:
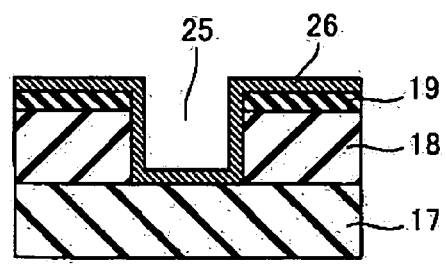

As shown in FIG. 5B, a protective film 26 is provided on the trench 25. The protective material 26 has a good etching rate ratio to the second interlayer dielectric film 18. The protective material 26 may be the same material as the first interlayer dielectric film 17.

Figure 5C:
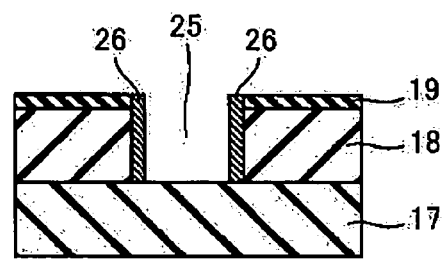

As shown in FIG. 5C, the protective layer 26 provided on the bottom surface of the trench 25 and on the top surface of the first cap film 19 is removed by anisotropic etching.

Figure 5D:
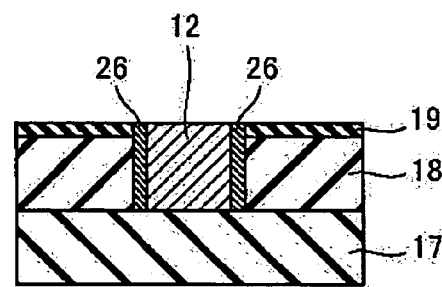

As shown in FIG. 5D, a Cu is provided on the entire surface and the Cu provided on except for the trench 25 is removed by planarization with CMP. So the wiring 12 is formed in the trench 25.

Figure 5E:
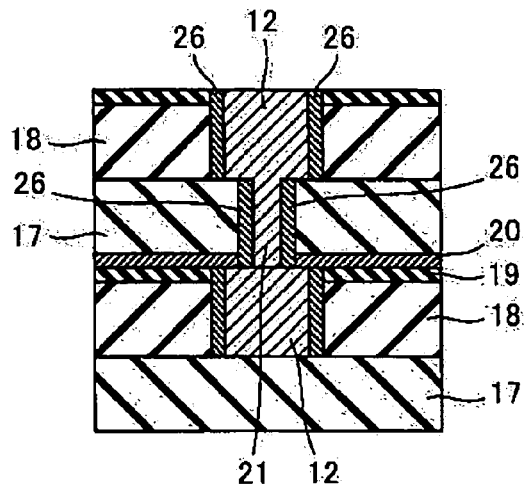

As shown in FIG. 5E, the second cap film 20 is provided on the wiring 12 and the first cap film 19. the via contact 21 and wiring 12 in the upper layer are provided.

In this third embodiment, a protective film 26 is provided on the side surface of the wiring 12 and via contact 21. So the wiring 12 and via contact 21 is protected by the protective film 26 from oxidization and other chemical damage during and after forming air gap 15.

Fourth Embodiment

A fourth embodiment of the present invention will be explained hereinafter with reference to FIG. 6.

In this fourth embodiment, another metal ring 13a is provided inside of the metal ring 13.

Figure 6:
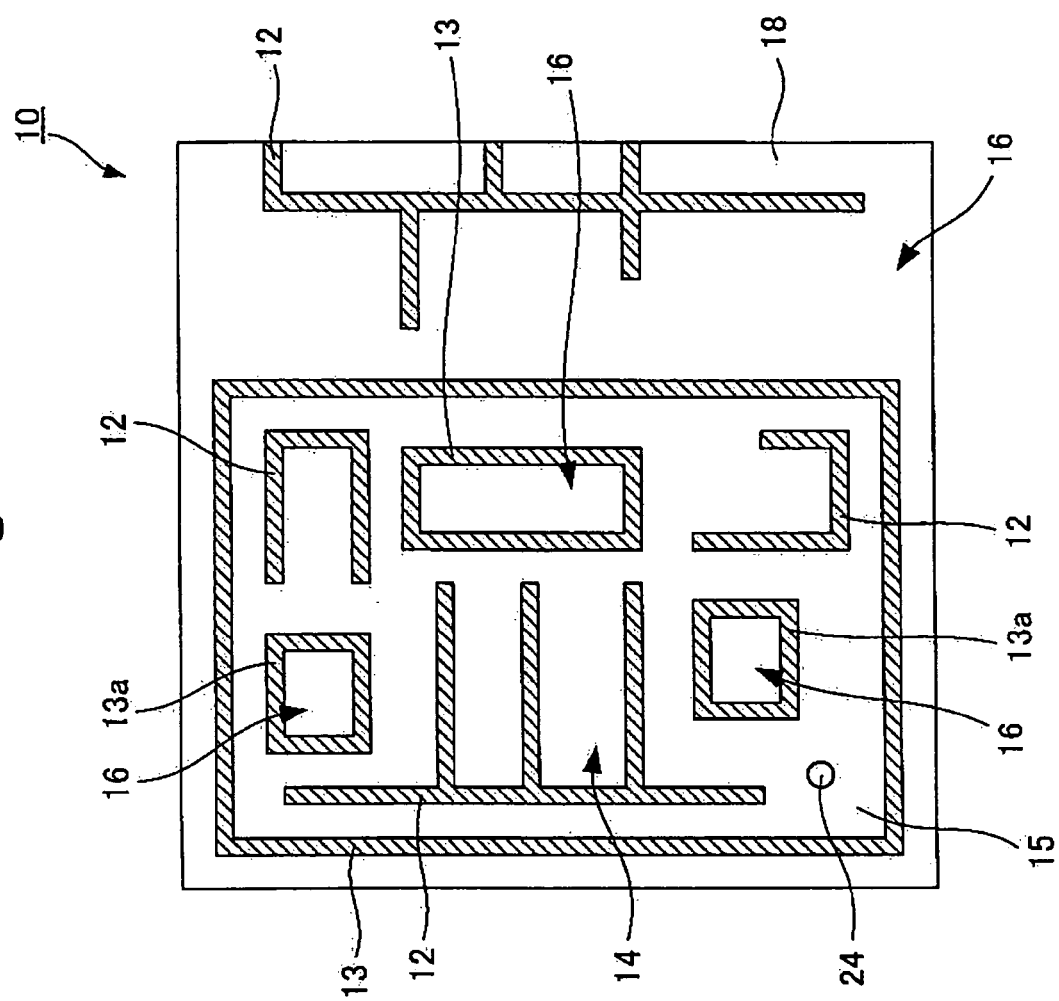
FIG. 6 is a plan view of a semiconductor device in accordance with a fourth embodiment.

FIG. 6 is a plan view of a semiconductor device in accordance with a fourth embodiment.

As shown in FIG. 6, three metal rings 13a are formed in the metal ring 13. A region between the metal ring 13 and the metal ring 13a is the air gap region 14. A region surrounded with the metal ring 13a is a non-air gap region 16. The cover member 24 on the outlet 23 is provided in the air gap region 14.

The metal ring 13a and the second interlayer dielectric film 18 may function as a support for the air gap 15 and improve mechanical strength.

In the non-air gap region 16 surrounded with the metal ring 13a, the wiring 12 and via contact 21 may be provided.

An extra metal wiring may be provided inside the metal ring 13a.

In this fourth embodiment, when there is a region in which reducing the capacitance between the wirings is less necessary, the region is surrounded with the metal ring 13a so as to improve mechanical strength. In such case, the metal ring 13a may function as a support pillar for the air gap region 15. Furthermore, the dielectric material is provided inside the metal ring 13a. So the capacitance between the support pillar and top and bottom layer may be reduced, since the amount of the conductive material of the support pillar is not so great with comparing to using metal pillar.

Fifth Embodiment

A fifth embodiment of the present invention will be explained hereinafter with reference to FIGS. 8-10D.

In this fifth embodiment, a metal ring 13b is provided in optional region and optional layer.

Figure 7:
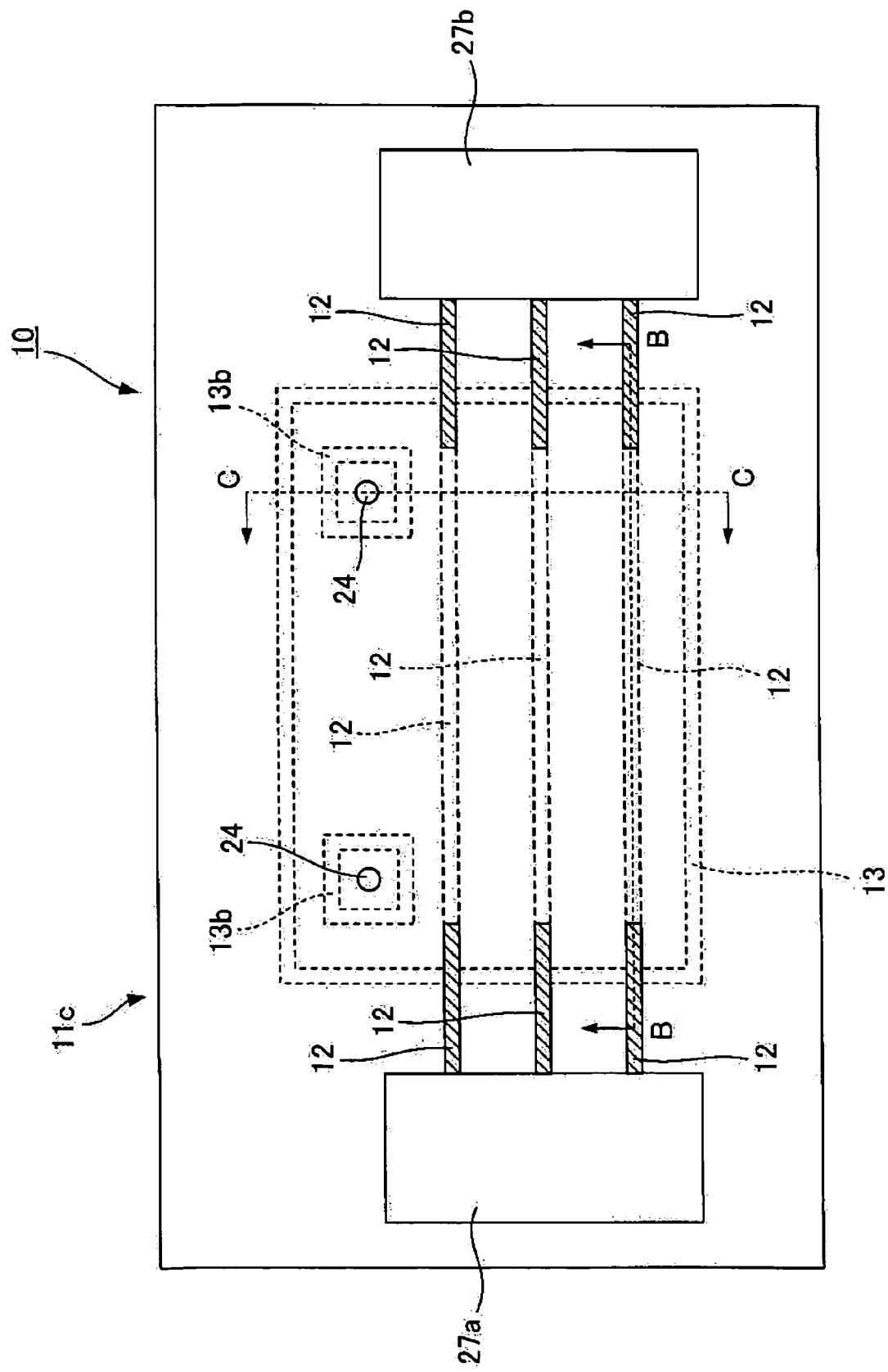
FIG. 7 is a plan view of a semiconductor device in accordance with a fifth embodiment.
Figure 8:
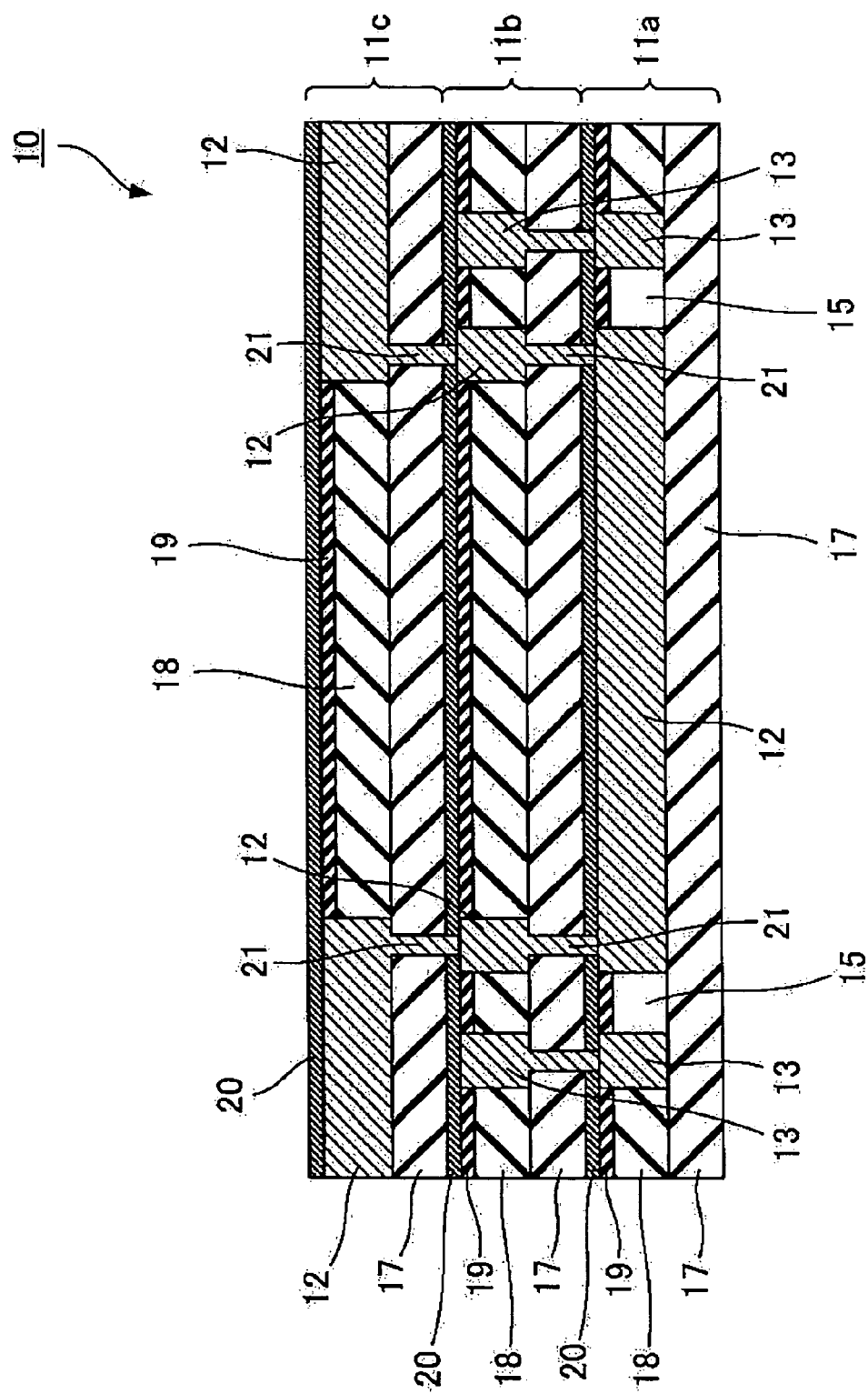
FIG. 8 is a cross sectional view taken along B-B in FIG. 7.

FIG. 7 is a plan view of a semiconductor device 10 in accordance with a fifth embodiment. FIG. 8 is a cross sectional view taken along B-B in FIG. 7.

In case a high speed signal transmission is operated between a circuit block 27a and 27b, the capacitance between the wirings from the circuit block 27a to 27b may be necessary.

As shown in FIG. 8, the wiring 12 from the circuit block 27a to 27b is provided in the wiring layer 11c and mainly in the wiring layer 11a. So the air gap 15 is provided in the wiring layer 11a in the air gap region 14. On the other hand, the air gap 15 is not provided in the wiring layer 11b even in the air gap region 14, since the wiring 12 between the circuit blocks 27a and 27b is provided less in the wiring layer 11b than the wiring layer 11a. So the air gap 15 is not provided so as to improve mechanical strength.

As shown in FIG. 9, the cover member 24 on the outlet 23 is provided in a region surrounded with the metal ring 13b. The metal ring 13b in the wiring layer 11b is not necessary. The third interlayer dielectric film 22 may be provided instead of the first and second interlayer dielectric films 17 and 18.

Next a manufacturing process of a semiconductor device in accordance with this fifth embodiment will be explained hereinafter with reference to FIGS. 10A-10D.

As shown in FIG. 10A, the wiring layers 11a, 11b, 11c are provided. The metal ring 13 is provided in the wiring layers 11a and 11b. The metal ring 13b is provided in the wiring layers 11b and 11c.

As shown in FIG. 10B, the outlet 23 is provided so as to reach the second dielectric film 18 in the wiring layer 11a. The outlet is provided in the region surrounded with the metal ring 13b.

As shown in FIG. 10C, the second interlayer dielectric film 18 in the wiring layer 11a in the air gap region 14 and the second interlayer dielectric film 18 in the wiring layer 11b and 11c in the region surrounded with the metal ring 13b are removed by isotropic etching. So air gap 15 is provided in the wiring layer 11a in the air gap region 14 and in the wiring layers 11b and 11c in the region surrounded with the metal ring 13b. The size of the air gap in the region surrounded with the metal ring 13b may be controlled by changing the size of the metal ring 13b.

As shown in FIG. 10D, the cover member 24 is provided in the outlet 23.

In this fifth embodiment, an air gap is provided in an optional region in an optional layer.

In this embodiment, the wiring 12 between the circuit blocks 27a and 27b is provided in the wiring layer 11a.

However the wiring 12 between the circuit blocks 27a and 27b may be provided in another layer.

Sixth Embodiment

A sixth embodiment of the present invention will be explained hereinafter with reference to FIG. 11.

Figure 11:
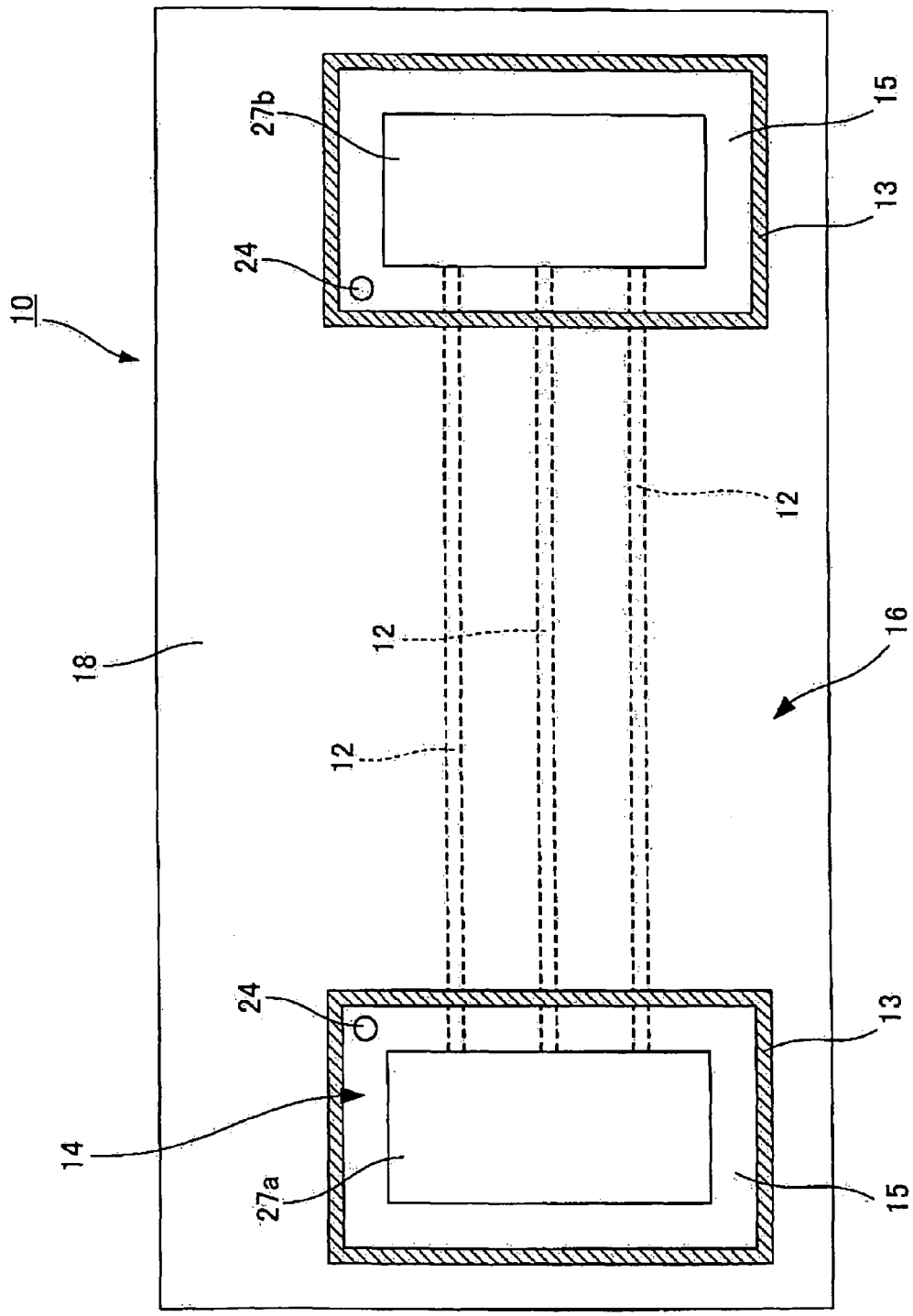
FIG. 11 is a plan view of a semiconductor device in accordance with a sixth embodiment.

FIG. 11 is a plan view of a semiconductor device in accordance with a sixth embodiment.

As shown in FIG. 11, the circuit blocks 27a and 27b are provided in the air gap region 14, respectively.

In this embodiment, the capacitance between the wiring in the circuit blocks 27a and 27b is reduced.

Seventh Embodiment

A seventh embodiment of the present invention will be explained hereinafter with reference to FIGS. 12-14D.

In this embodiment, a modification of the cover member 24 is explained.

Figure 12:
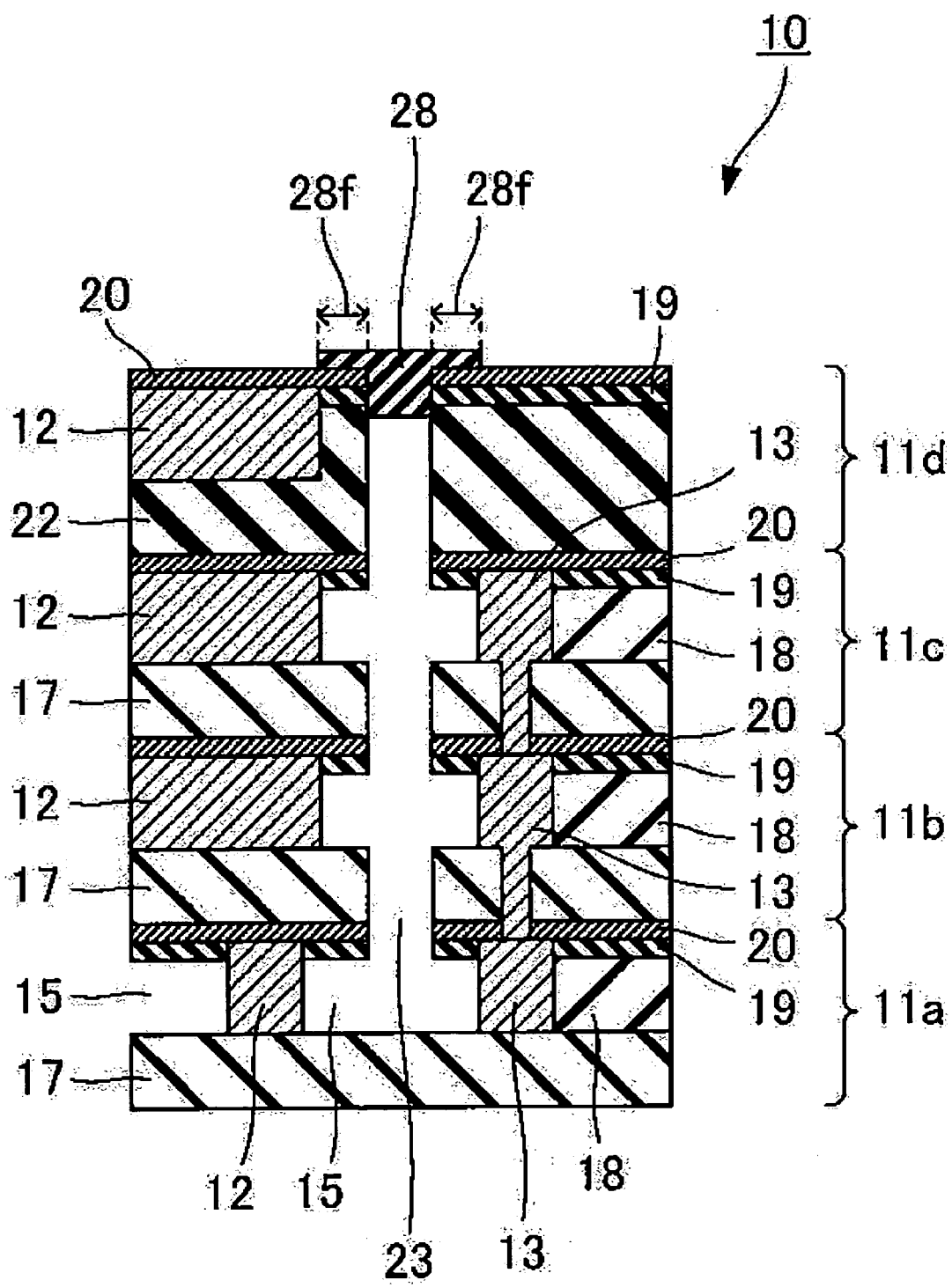
FIG. 12 is a cross sectional view of a semiconductor device in accordance with a seventh embodiment.

FIG. 12 is an enlarged cross sectional view around outlet 23 in the semiconductor device 100 in accordance with a seventh embodiment.

As shown in FIG. 12, a cover member 28 is provided on the second cap film 20 and near the top portion of the outlet 23. The outlet 23 is not filled with the cover member 28.

The cover member 28 may be SiO2, SiOC, organic dielectric or the like. The viscosity of the cover member 28 may be controlled by the material of the solvent.

It is preferable that the cover member 28 has high viscosity during depositing on the outlet 23. If the cover member 28 is formed by CVD (Chemical Vapor Deposition) which has low viscosity during depositing, the cover member 28 may not be cover the opening of the outlet 23 and not shut the outlet 23. Furthermore, the cover member 28 may formed in the air gap 15.

In case the cover member 28 is provided only near the opening of the outlet 23, the cover member 28 is hardly supplied to the air gap 15.

In case the cover member 28 is provided only near the opening of the outlet 23, the cover member 28 may have a small molecule size which the water in the dielectric films 17, 18 and the air gap 15 are passed through. So it may be available to exhaust the water efficiently to outside in the structure as shown in FIG. 12 with comparing to the structure in which the outlet is filled with the cover member.

In FIG. 12, the cover member 28 has a fringe portion 28f. However, the fringe portion 28f is not provided. In case the fringe portion 28f is not provided, the top surface of the cover member 28 may coincide with the top surface of the second cap film 20.

In case the fringe portion 28f is not provided, the cover member 28 provided on the second cap film 20 is removed by an etching back or CMP.

Next, a manufacturing process of the semiconductor device 10 will be explained hereinafter with reference to FIGS. 13A-13D.

Figure 13A:
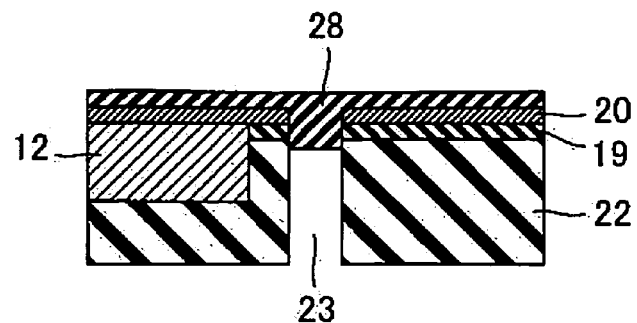
FIGS. 13A-13D are cross sectional view showing a manufacturing process of a semiconductor device in accordance with the seventh embodiment.

As shown in FIG. 13A, the cover member 28 is formed by SOG or the like. The cover member 28 is provided on the opening of the outlet 23 so as to shut the outlet 23 and on the second cap film 20.

Figure 13B:
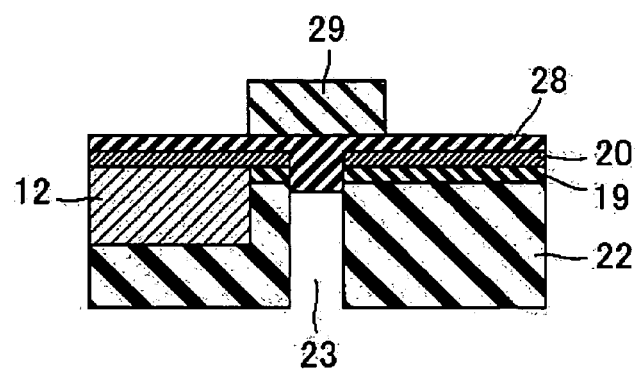

As shown in FIG. 13B, a resist 29 is provided on the cover member 28 by using lithography.

Figure 13C:
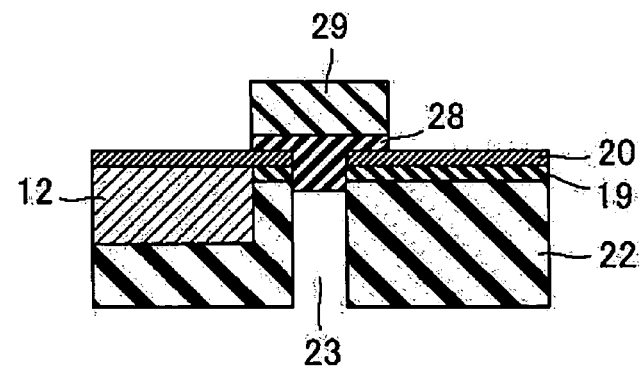

As shown in FIG. 13C, a part of the cover member 28 is removed by RIE or the like with the resist 29 as the mask.

Figure 13D:
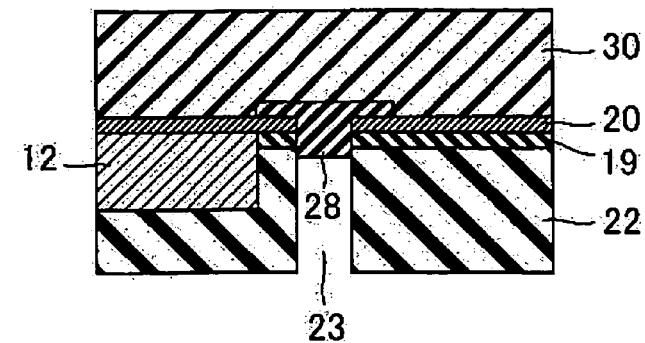

As shown in FIG. 13D, after the resist 29 is removed, a dielectric material 30 such as SiOC is provided on the cover member 28 and the second cap film 20. The water contained in the dielectric layers and air gap may be exhausted.

In case the cover member 28 has lower mechanical strength, a part of the cover member 28 which is not necessary for shutting the outlet 23 is removed so as to improve mechanical strength. However, the cover member 28 may be as shown in FIG. 13A.

The cover member 28 and dielectric material 30 may be formed in a same manufacturing process. In such case, the cover member 28 is formed so as to be thick.

In case a plurality of the outlet 23 is provided, the outlets 23 are covered by one cover member 28.

In case the etching rate ratio between the resist 29 and the cover member 28 is small, an additional film 31 which has a good etching rate ratio to the resist 29 and the cover member 28 may be provided on the cover member 28.

As shown in FIGS. 14A-14D, the additional film 31 may be provided on the cover member 28.

The manufacturing process of the semiconductor device having the additional film 31 will be explained with reference to FIGS. 14A-14D.

Figure 14A:
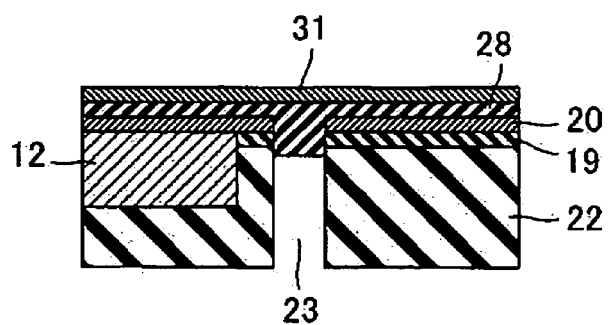
FIGS. 14A-14D are cross sectional view showing another manufacturing process of a semiconductor device in accordance with the seventh embodiment.

As shown in FIG. 14A, the additional film 31 is formed on the cover member 28.

Figure 14B:
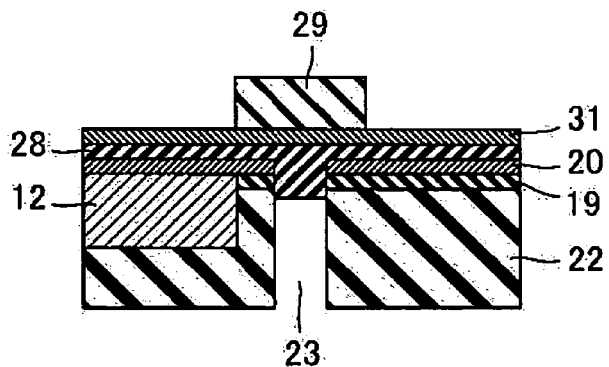

As shown in FIG. 14B, the resist 29 is formed on the additional film 31 by using lithography.

Figure 14C:
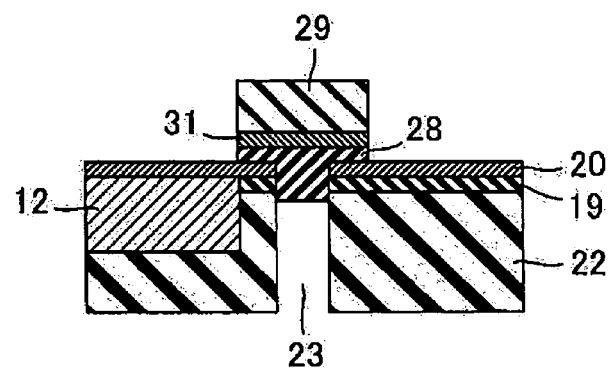

As shown in FIG. 14C, a part of the cover member 28 and additional film 31 are removed by etching with the resist 29 as a mask.

Figure 14D:
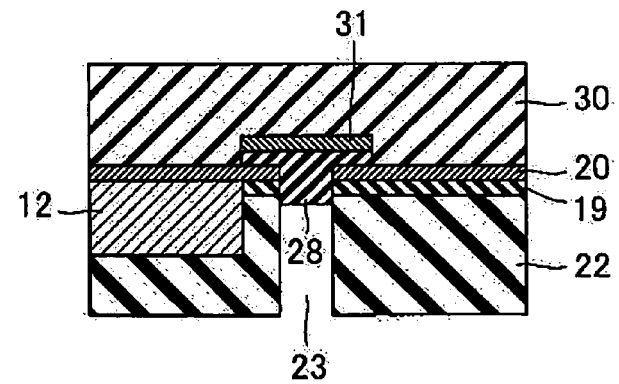

As shown in FIG. 14D, after removing the resist 29, the dielectric material 31 is provided on the additional film 31 and the second cap film 20. The resist 29 is removed before or after pattering the cover member 28. The additional film 31 may be removed before forming dielectric material 30.

In this seventh embodiment, in case the cover member 28 has high viscosity such as SOD or SOG dielectric, the cover member 28 is provided only near the opening of the outlet 23. So the cover member 28 is hardly supplied to the air gap 15. It may be easy to exhaust water in the dielectric layer and air gap.

Embodiments of the invention have been described with reference to the examples. However, the invention is not limited thereto.

For example, the first interlayer dielectric film may be SiC and the second interlayer dielectric film may be $SiO_2$. In this case, the etchant for removing the second interlayer dielectric 18 may be hydrofluoric acid (HF), ammonium fluoride or the like.

For example, the manufacturing method in the second embodiment may be applicable to other embodiments. The protective film in the third embodiment may be applicable to other embodiments.

For example, the metal ring 13 may be formed by a wiring 13. Namely, the metal ring 13 is not provided in the layer corresponding to a layer having the first interlayer dielectric film 17 and the metal ring 13 is provided in the layer corresponding to a layer having the second interlayer dielectric film 17. A plurality of metal rings, which is not connected in a vertical direction, may be provided in the wiring layers 11a, 11b, and 11c, respectively.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
    a semiconductor substrate having a semiconductor element on an upper surface;
    a first wiring layer provided on or above the semiconductor substrate, the first wiring including a first dielectric film and a first wiring;

a second wiring layer on or above the semiconductor substrate, the second wiring layer including a second dielectric film and a second wiring;

a metal ring provided in the second dielectric film and configured to form a closed loop in a plan view;

a first region surrounded by the metal ring in a plan view;

a second region provided outside of the metal ring in a plan view;

a through hole provided in the first wiring layer and the second wiring layer and penetrating the first wiring layer and the second wiring layer, and provided in the first region, the through hole provided in the closed loop of the metal ring in the second wiring layer; and an air gap provided in the first dielectric film in the second region.

2. A semiconductor device of claim 1, wherein a via contact and the wiring are not provided in the first region.

3. A semiconductor device of claim 1, further comprising, a cover member provided in the through hole.

4. A semiconductor device of claim 3, wherein the cover member is provided on a top portion of the through hole, and a gas is provided in the through hole.

5. A semiconductor device of claim 1, further comprising a protective film provided on a side surface of the wiring.

6. A semiconductor device of claim 1, wherein a plurality of circuit blocks which are connected by the wiring and the via contacts are provided in the second region and, and a part of the first and second wiring is provided in the first region.

7. A semiconductor device of claim 1, further comprising
a third dielectric film provided above the second wiring layer;

wherein the through hole is provided in the third dielectric film in the first region, which penetrates the third dielectric film; and the cover member provided on the third dielectric film and configured to cover a top portion of the through hole, and a gas is provided in the through hole.

8. A semiconductor device of claim 1, further comprising another metal ring provided in the second region in the first wiring layer and the second wiring layer and configured to form a closed loop in a plan view, and a first circuit block provided in the first region;

a second circuit block provided in the second region and surrounded by the another metal ring.

9. A semiconductor device, comprising:

a semiconductor substrate having a semiconductor element on an upper surface;

a first wiring layer provided on or above the semiconductor substrate, the first wiring layer including a first dielectric film and a first wiring;

a second wiring layer on or above the semiconductor substrate, the second wiring layer including a second dielectric film and a second wiring;

a first metal ring provided in the second dielectric film and configured to form a first closed loop in a plan view;

a second metal ring provided in the first dielectric film and configured to form a second closed loop outside of the first closed loop in a plan view;

a first region surrounded by the first metal ring in a plan view;

a second region surrounded by the second metal ring and provided outside of the first metal ring in a plan view;

a through hole provided in the first wiring layer and the second wiring layer and penetrating the first wiring layer and the second wiring layer, and provided in the first region, the through hole provided in the closed loop of the metal ring in the second wiring layer; and an air gap provided in the first dielectric film in the second region.

10. A semiconductor device of claim 9, wherein the via contacts and the wirings are not provided in the first region.

11. A semiconductor device of claim 9, further comprising, a cover member provided in the through hole.

12. A semiconductor device of claim 11, wherein the cover member is provided on a top portion of the through hole, and a gas is provided in the through hole.

13. A semiconductor device of claim 9, further comprising
a third dielectric film provided above the second wiring layer;

wherein the through hole is provided in the third dielectric film in the first region, which penetrates the third dielectric film; and the cover member provided on the third dielectric film and configured to cover a top portion of the through hole, and a gas is provided in the through hole.

14. A method for manufacturing semiconductor device, comprising:

forming a first dielectric film on a semiconductor substrate having a semiconductor element on an upper surface;

forming a wiring structure in the first dielectric film;

forming a second dielectric film on the first dielectric film and the wiring structure;

forming a metal ring in the second dielectric film so as to form a closed loop in a plan view;

forming an outlet to the first dielectric film inside the closed loop of the metal ring so as to expose a part of the first and second dielectric film in the inside of the closed loop of the metal ring; and removing part of the first dielectric film from the outlet to form an air gap in the first dielectric film outside the closed loop of the metal ring.

15. A method for manufacturing semiconductor device of claim 14, further comprising, forming a cover member on the second dielectric film and providing a gas in the outlet.

16. A method for manufacturing semiconductor device of claim 15, wherein the cover member is provided on a top surface of the second dielectric film.

17. A method for manufacturing semiconductor device of claim 16, wherein the cover member is provided by spin on glass method or spin on deposition.

* * * * *